(12) United States Patent
Nishimura et al.

(10) Patent No.: US 10,272,426 B2
(45) Date of Patent: Apr. 30, 2019

(54) METHOD OF PRODUCING MICROFLUIDIC DEVICE, MICROFLUIDIC DEVICE, AND PHOTOSENSITIVE RESIN COMPOSITION

(71) Applicant: JSR CORPORATION, Tokyo (JP)

(72) Inventors: Isao Nishimura, Tokyo (JP); Kenji Hoshiko, Tokyo (JP); Masahiro Kaneko, Tokyo (JP)

(73) Assignee: JSR CORPORATION, Tokyo (JP)

( * ) Notice: Subject to any disclaimer, the term of this patent is extended or adjusted under 35 U.S.C. 154(b) by 67 days.

(21) Appl. No.: 15/133,202

(22) Filed: Apr. 19, 2016

(65) Prior Publication Data

US 2016/0310944 A1 Oct. 27, 2016

(30) Foreign Application Priority Data

| Apr. 21, 2015 | (JP) | 2015-086664 |
| Dec. 28, 2015 | (JP) | 2015-256813 |
| Mar. 9, 2016 | (JP) | 2016-045869 |

(51) Int. Cl.
| *B81C 1/00* | (2006.01) |
| *B01L 3/00* | (2006.01) |
| *B32B 37/14* | (2006.01) |
| *B32B 38/00* | (2006.01) |
| *G03F 7/031* | (2006.01) |

(52) U.S. Cl.
CPC ........ *B01L 3/502707* (2013.01); *B32B 37/14* (2013.01); *B32B 38/0008* (2013.01); *B81C 1/00119* (2013.01); *G03F 7/031* (2013.01); *B01L 2200/12* (2013.01); *B01L 2300/041* (2013.01); *B01L 2300/0848* (2013.01); *B01L 2300/0887* (2013.01); *B01L 2300/12* (2013.01); *B81B 2201/058* (2013.01); *B81C 2203/032* (2013.01)

(58) Field of Classification Search
None
See application file for complete search history.

(56) References Cited

U.S. PATENT DOCUMENTS

| 5,702,820 A | 12/1997 | Yokoshima et al. |
| 5,847,015 A | 12/1998 | Tajima et al. |
| 6,013,415 A | 1/2000 | Sakurai et al. |
| 6,120,973 A | 9/2000 | Itano et al. |
| 2004/0142280 A1 | 7/2004 | Iwanaga et al. |
| 2007/0231735 A1 | 10/2007 | Pawlowski et al. |
| 2007/0275193 A1* | 11/2007 | DeSimone ........ B01L 3/502707 428/34.1 |
| 2008/0085458 A1 | 4/2008 | Yamato et al. |
| 2009/0087759 A1 | 4/2009 | Matsumoto et al. |
| 2009/0281250 A1* | 11/2009 | DeSimone ............ B29C 66/723 525/418 |
| 2009/0286308 A1 | 11/2009 | Berthelot et al. |
| 2010/0188765 A1 | 7/2010 | Matsumoto et al. |
| 2010/0261286 A1 | 10/2010 | Kim et al. |
| 2011/0086309 A1 | 4/2011 | Nankawa et al. |
| 2011/0086938 A1 | 4/2011 | Nishikawa et al. |
| 2011/0129778 A1 | 6/2011 | Murata et al. |
| 2012/0034566 A1 | 2/2012 | Wada et al. |

FOREIGN PATENT DOCUMENTS

| JP | H05019467 | 1/1993 |
| JP | H06230212 | 8/1994 |
| JP | H07140654 | 6/1995 |
| JP | H07207211 | 8/1995 |
| JP | H08259876 | 10/1996 |
| JP | H10031308 | 2/1998 |
| JP | H10300922 | 11/1998 |
| JP | H11140144 | 5/1999 |
| JP | H11174224 | 7/1999 |
| JP | H11258415 | 9/1999 |
| JP | 2000-056118 | 2/2000 |
| JP | 2003-241372 | 8/2003 |
| JP | 2003-307849 | 10/2003 |
| JP | 2004-101728 | 4/2004 |
| JP | 2004-130219 | 4/2004 |
| JP | 2005-329479 | 12/2005 |
| JP | 2008-506749 | 3/2008 |
| JP | 2008-181095 | 8/2008 |
| JP | 2008-276194 | 11/2008 |
| JP | 2009-501908 | 1/2009 |
| JP | 2009-519904 | 5/2009 |
| JP | 2009-519991 | 5/2009 |
| JP | 2009-134255 | 6/2009 |
| JP | 2009-531730 | 9/2009 |
| JP | 2009-221370 | 10/2009 |
| JP | 2010-070614 | 4/2010 |
| JP | 2010-237053 | 10/2010 |
| JP | 2011-132215 | 7/2011 |
| WO | 2009121944 | 10/2009 |
| WO | 2010001691 | 1/2010 |
| WO | 2010146883 | 12/2010 |

OTHER PUBLICATIONS

"Search Report of European Counterpart Application", dated Sep. 28, 2016, p. 1-p. 7.

(Continued)

*Primary Examiner* — Paul S Hyun
(74) *Attorney, Agent, or Firm* — JCIPRNET

(57) ABSTRACT

The present disclosure relates to a method of producing a microfluidic device, a microfluidic device, and a photosensitive resin composition, the method including the steps of: forming a resin layer on a support from a photosensitive resin composition that includes a compound having at least two radical-polymerizable groups, a photoradical generator, a compound having at least two cationically reactive groups, a photocation generator, and at least one compound selected from a protective group-containing amine, a photodegradable base, an imide structure-containing compound, an amide structure-containing compound and an urea structure-containing compound; partially UV-exposing and developing the resin layer; preparing a laminate by placing a cover material on the thus developed resin layer; and UV-exposing the thus obtained laminate.

10 Claims, 1 Drawing Sheet

(56) References Cited

OTHER PUBLICATIONS

"Office Action of Taiwan Counterpart Application," dated Nov. 28, 2018, with English translation thereof, p. 1-14.

* cited by examiner

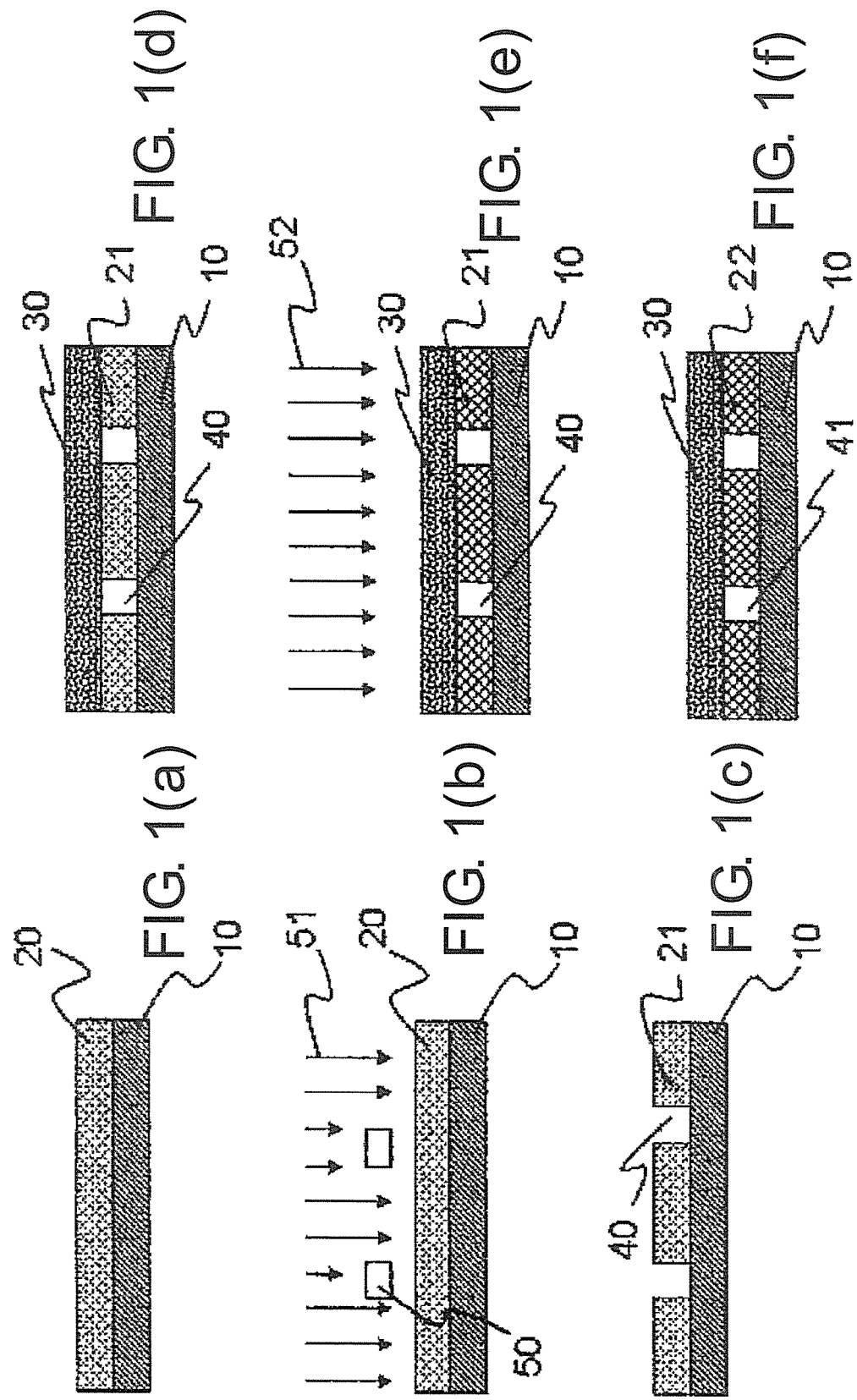

METHOD OF PRODUCING MICROFLUIDIC DEVICE, MICROFLUIDIC DEVICE, AND PHOTOSENSITIVE RESIN COMPOSITION

CROSS-REFERENCE TO RELATED APPLICATIONS

The present application is an application claiming priority to Japanese Patent Application No. 2015-86664, filed Apr. 21, 2015, Japanese Patent Application No. 2015-256813, filed Dec. 28, 2015, and Japanese Patent Application No. 2016-45869, filed Mar. 9, 2016, under the Paris Convention. The contents of these applications are incorporated herein by reference in their entirety.

BACKGROUND OF THE INVENTION

Field of the Invention

The present invention relates to a method of producing a microfluidic device; a microfluidic device; and a photosensitive resin composition.

Discussion of the Background

Microfluidic devices (also referred to as "microchannel devices", "microchannel chips", "microreactors" and the like), which are compact devices comprising a chip substrate in which a fine flow channel for fluids such as liquids and gases, a valve, inlet and outlet of the fluids and the like are formed, have been developed and increasingly applied to a wide range of uses such as separation analysis, sensing and chemical reaction of various substances.

As an example of such applications, in recent years, high-throughput screening of pharmaceuticals, agricultural chemicals and the like, where a microfluidic device is utilized to perform separation, analysis and synthesis of biologically relevant substances including proteins, nucleic acids such as DNA and RNA, and sugar chains, has drawn attention.

Specifically, a microfluidic device comprises a capillary micro flow channel inside a member such as a glass or resin substrate, a pump element provided for transport of a fluid through the flow channel, a detection element and the like.

As for a method of producing a flow channel of such a microfluidic device, there are known production methods utilizing a two-step curing mechanism which comprises a step of preparing a patterned resin layer from an energy ray-curable resin composition (photosensitive resin composition) on a support by photolithography (hereinafter, also simply referred to as "lithography") and a step of subsequently bonding a cover material thereon (JP-A-2009-134255, JP-A-2009-221370 and JP-A-2010-070614).

SUMMARY OF THE INVENTION

According to one aspect of the present invention, a method of producing a microfluidic device, the method comprising:

a step (1) of forming a resin layer on a support from a photosensitive resin composition that comprises a compound having at least two radical-polymerizable groups, a photoradical generator, a compound having at least two cationically reactive groups, a photocation generator, and at least one compound selected from a protective group-containing amine, a photodegradable base, an imide structure-containing compound, an amide structure-containing compound and an urea structure-containing compound;

a step (2) of partially UV-exposing and developing the resin layer;

a step (3) of preparing a laminate by placing a cover material on the thus developed resin layer; and a step (4) of UV-exposing the thus obtained laminate.

According to another aspect of the present invention, a microfluidic device comprising a flow channel inside a member, the flow channel comprising:

a flow channel wall formed on a support using a photosensitive resin composition that comprises a compound having at least two radical-polymerizable groups, a photoradical generator, a compound having at least two cationically reactive groups, a photocation generator, and at least one compound selected from a protective group-containing amine, a photodegradable base, an imide structure-containing compound, an amide structure-containing compound and an urea structure-containing compound; and a cover material that covers a groove formed by the support and the flow channel wall.

According to further aspect of the present invention, a photosensitive resin composition for production of a microfluidic device, the photosensitive resin composition comprising: a compound having at least two radical-polymerizable groups; a photoradical generator; a compound having at least two cationically reactive groups; a photocation generator; and at least one compound selected from a protective group-containing amine, a photodegradable base, an imide structure-containing compound, an amide structure-containing compound and an urea structure-containing compound.

BRIEF DESCRIPTION OF DRAWINGS

FIG. 1(a) to FIG. 1(f) are a set of cross-sectional schematic views illustrating one example of the method of producing a microfluidic device according to the embodiments of the present invention.

DESCRIPTION OF THE EMBODIMENTS

The embodiments of the present invention relates to a method of producing a microfluidic device which contains specific steps, a microfluidic device and a photosensitive resin composition for production of a microfluidic device. Embodiments of the present invention are given below.

[1] A method of producing a microfluidic device, the method comprising:

a step (1) of forming a resin layer on a support from a photosensitive resin composition that comprises a compound having at least two radical-polymerizable groups, a photoradical generator, a compound having at least two cationically reactive groups, a photocation generator, and at least one compound selected from a protective group-containing amine, a photodegradable base, an imide structure-containing compound, an amide structure-containing compound and an urea structure-containing compound;

a step (2) of partially UV-exposing and developing the resin layer;

a step (3) of preparing a laminate by placing a cover material on the thus developed resin layer; and a step (4) of UV-exposing the thus obtained laminate.

[2] The method of producing a microfluidic device according to [1], wherein the photosensitive resin composition further comprises an alkali-soluble resin.

[3] The method of producing a microfluidic device according to [1] or [2], wherein a dose of the UV-exposure in the step (2) is less than a dose of the UV-exposure in the step (4).

[4] The method of producing a microfluidic device according to any one of [1] to [3], wherein the light source of the UV-exposure in the step (2) is the same as the light source of the UV-exposure in the step (4).

[5] A microfluidic device comprising a flow channel inside a member, the flow channel comprising:

a flow channel wall formed on a support using a photosensitive resin composition that comprises a compound having at least two radical-polymerizable groups, a photoradical generator, a compound having at least two cationically reactive groups, a photocation generator, and at least one compound selected from a protective group-containing amine, a photodegradable base, an imide structure-containing compound, an amide structure-containing compound and an urea structure-containing compound; and a cover material that covers a groove formed by the support and the flow channel wall.

[6] A photosensitive resin composition for production of a microfluidic device, the photosensitive resin composition comprising: a compound having at least two radical-polymerizable groups; a photoradical generator; a compound having at least two cationically reactive groups; a photocation generator; and at least one compound selected from a protective group-containing amine, a photodegradable base, an imide structure-containing compound, an amide structure-containing compound and an urea structure-containing compound.

According to the embodiments of the present invention, by allowing a patterned resin layer obtained by lithography to have sufficient strength and tackiness, a microfluidic device comprising a favorable flow channel and the like that do not cause leakage or the like of a fluid passing therethrough can be produced.

1. Photosensitive Resin Composition

In the method of producing a microfluidic device according to the embodiments of the present invention, a photosensitive resin composition (hereinafter, also simply referred to as "composition") is used. This composition comprises: a compound having at least two radical-polymerizable groups (hereinafter, also referred to as "radical-polymerizable compound"); a compound having at least two cationically reactive groups (hereinafter, also referred to as "cationically reactive compound"); a photoradical generator; a photocation generator; and at least one compound selected from a protective group-containing amine, a photodegradable base, an imide structure-containing compound, an amide structure-containing compound and an urea structure-containing compound (hereinafter, also referred to as "protective group-containing amines, etc.").

By using such a composition, a patterned resin layer having tackiness and sufficient strength can be formed after lithography. Consequently, a cover material can be bonded thereon with sufficient bonding strength, and this enables to produce a microfluidic device comprising a favorable flow channel and the like.

In cases where the microfluidic device is used for detection, separation, analysis, extraction and the like of a biologically relevant substance, since fluorescence is usually used, it is preferred that the microfluidic device, particularly the resin layer (flow channel wall) thereof, be a resin layer that exhibits little self-luminescence and contains no aromatic ring that causes self-luminescence, and it is also preferred that the photosensitive resin composition used as a material of the resin layer contains no compound having an aromatic ring.

It is presumed that, in the above-described composition, the first exposure (step (2)) preferentially allows cross-linking of the radical-polymerizable compound to progress with radicals generated by the photoradical generator and the second exposure performed after development (step (4)) allows cross-linking of the cationically reactive compound to progress with cations generated by the photocation generator, thereby a favorable (flow channel) wall is formed. The cross-linking density is believed to be increased by the cross-linking of the radical-polymerizable compound; therefore, the patterned resin layer after lithography is presumed to have sufficient strength.

It is believed that cations are also generated from the photocation generator by the first exposure. The protective group-containing amines, etc. that are contained in the composition are capable of capturing the cations generated by the first exposure; therefore, they can inhibit the progress of the cross-linking of the cationically reactive compound induced by the cations generated by the first exposure. It is believed that, as a result, non-cross-linked cationically reactive compound remains in the patterned resin layer after lithography, and the resin layer is thus presumed to have good tackiness.

1-1. Radical-Polymerizable Compound

The radical-polymerizable compound is a compound having at least two radical-polymerizable groups, and it is preferably a compound that is cross-linked by polymerization reaction induced by radicals generated by irradiation with UV in the presence of a photoradical generator.

Since the radical-polymerizable compound has good polymerizability, the cross-linking density of the resulting patterned resin layer can be improved. Thus, a patterned resin layer having excellent strength can be formed.

Such a radical-polymerizable compound may be used individually, or two or more thereof may be used.

Examples of the radical-polymerizable compound include polyfunctional (meth)acrylates obtained by a reaction between an aliphatic polyhydroxy compound and (meth)acrylic acid; caprolactone-modified polyfunctional (meth)acrylates; alkylene oxide-modified polyfunctional (meth)acrylates; polyfunctional urethane (meth)acrylates obtained by a reaction between a hydroxyl group-containing (meth)acrylate and a polyfunctional isocyanate; and carboxyl group-containing polyfunctional (meth)acrylates obtained by a reaction between a hydroxyl group-containing polyfunctional (meth)acrylate and an acid anhydride.

In the present specification, the term "(meth)acryl" represents acryl and/or methacryl.

Specific examples of the radical-polymerizable compound include: bifunctional acrylates such as 1,3-butanediol di(meth)acrylate, 1,4-butanediol di(meth)acrylate, 1,6-hexanediol di(meth)acrylate, ethylene glycol di(meth)acrylate, diethylene glycol di(meth)acrylate, neopentyl glycol di(meth)acrylate, triethylene glycol di(meth)acrylate, propylene glycol di(meth)acrylate, butylene glycol di(meth)acrylate, tetraethylene glycol di(meth)acrylate, polyethylene glycol di(meth)acrylate, bisphenol A bis(acryloyloxyethyl) ether, bisphenol A di(meth)acryloyloxymethylethyl ether, bisphenol A di(meth)acryloyloxyethyloxyethyl ether, ethoxylated bisphenol A di(meth)acrylate, propoxylated neopentyl glycol di(meth)acrylate, propoxy-modified bisphenol A di(meth)acrylate, ethoxy-propoxy-modified bisphenol A di(meth)acrylate, propoxy-modified bisphenol F di(meth)acrylate, ethoxylated neopentyl glycol di(meth)acrylate, 3-methylpentanediol di(meth)acrylate, trimethylolpropane di(meth)acrylate, tris(2-hydroxyethyl)isocyanurate di(meth)acrylate, tricyclodecane dimethanol di(meth)acrylate, and epoxy (meth)acrylate obtained by addition of (meth)acrylic acid to diglycidyl ether of bisphenol A; tri- or higher functional acrylates, such as trimethylolpropane tri(meth)acrylate, pentaerythritol tri(meth)acrylate, tetramethylolpropane tetra(meth)acrylate, tris(2-hydroxyethyl)isocyanurate tri(meth)acrylate, ethoxylated trimethylolpropane tri(meth)acrylate, ethoxylated pentaerythritol tetra(meth)acrylate, propoxylated trimethylolpropane tri(meth)acrylate, pentaerythritol tetra(meth)acrylate, dipentaerythritol penta(meth)acrylate, dipentaerythritol hexa(meth)acrylate, tripentaerythritol tetra(meth)acrylate, tripentaerythritol penta(meth)acrylate, tripentaerythritol hexa(meth)acrylate, tripentaerythritol hepta(meth)acrylate, tripentaerythritol octa(meth)acrylate, reaction products of pentaerythritol tri(meth)acrylate and an acid anhydride, reaction products of dipentaerythritol penta(meth)acrylate and an acid anhydride, reaction products of tripentaerythritol hepta(meth)acrylate and an acid anhydride, propoxy-modified pentaerythritol tetra(meth)acrylate, propoxy-modified dipentaerythritol poly(meth)acrylate, butoxy-modified pentaerythritol tetra(meth)acrylate, butoxy-modified dipentaerythritol poly(meth)acrylate, caprolactone-modified trimethylolpropane tri(meth)acrylate, caprolactone-modified pentaerythritol tri(meth)acrylate, caprolactone-modified tris(2-hydroxyethyl)isocyanurate tri(meth)acrylate, caprolactone-modified pentaerythritol tetra(meth)acrylate, caprolactone-modified dipentaerythritol penta(meth)acrylate, caprolactone-modified dipentaerythritol hexa(meth)acrylate, caprolactone-modified tripentaerythritol tetra(meth)acrylate, caprolactone-modified tripentaerythritol penta(meth)acrylate, caprolactone-modified tripentaerythritol hexa(meth)acrylate, caprolactone-modified tripentaerythritol hepta(meth)acrylate, caprolactone-modified tripentaerythritol octa(meth)acrylate, reaction products of caprolactone-modified pentaerythritol tri(meth)acrylate and an acid anhydride, reaction products of caprolactone-modified dipentaerythritol penta(meth)acrylate and an acid anhydride, and reaction products of caprolactone-modified tripentaerythritol hepta(meth)acrylate and an acid anhydride; compounds obtained by a reaction between epoxy (meth)acrylate and a carboxylic acid such as oxalic acid, malonic acid, succinic acid or hydrogenated phthalic acid, an alcoholic compound or a phenolic compound; and reaction products of an alkylene glycol diglycidyl ether or a polyalkylene glycol diglycidyl ether and (meth)acrylic acid.

Thereamong, from the standpoint of the strength of the resulting patterned resin layer, tri- or higher functional acrylates such as dipentaerythritol penta(meth)acrylate, dipentaerythritol hexa(meth)acrylate, tripentaerythritol hexa(meth)acrylate, caprolactone-modified dipentaerythritol hexa(meth)acrylate, ethoxylated pentaerythritol tetra(meth)acrylate, propoxy-modified pentaerythritol tetra(meth)acrylate, propoxy-modified dipentaerythritol poly(meth)acrylate, butoxy-modified pentaerythritol tetra(meth)acrylate, butoxy-modified dipentaerythritol poly(meth)acrylate and caprolactone-modified tripentaerythritol hexa(meth)acrylate, are preferred. Further, from the standpoints of absorption of the exposure light and inhibiting self-luminescence of the resulting (flow channel) wall, (meth)acrylates containing no aromatic ring are preferred.

The content ratio of the radical-polymerizable compound is usually 1 to 60% by mass, preferably 5 to 50% by mass, more preferably 10 to 40% by mass, with respect to 100% by mass of the solids contained in the composition. The term "solids" refers to all of the components contained in the composition other than solvent.

By incorporating the radical-polymerizable compound in such an amount, a patterned resin layer having tackiness and sufficient strength (sufficient self-supporting and shape-retaining properties) can be formed.

1-2. Photoradical Generator

The photoradical generator is a compound that generates radicals when irradiated with light and initiates radical polymerization of the radical-polymerizable compound. From the standpoint of performing the first exposure using UV radiation and inhibiting self-luminescence of the resulting (flow channel) wall, it is preferred that the maximum absorption wavelength of the photoradical generator be in the ultraviolet region, preferably 150 nm to 380 nm.

Such a photoradical generator may be used individually, or two or more thereof may be used.

In the embodiments of the present invention, the maximum absorption wavelength of a compound can be observed as, for example, a wavelength at which maximum absorption is obtained when the transmittance of a solution prepared by dissolving the compound in its good solvent is measured (optical path length=1 cm).

Examples of the photoradical generator include those compounds described in JP-A-2008-276194, JP-A-2003-241372, Japanese Translated PCT Patent Application Laid-open No. 2009-519991, Japanese Translated PCT Patent Application Laid-open No. 2009-531730, WO 2010/001691, WO 2010/146883, JP-A-2011-132215, Japanese Translated PCT Patent Application Laid-open No. 2008-506749, Japanese Translated PCT Patent Application Laid-open No. 2009-519904 and the like.

The photoradical generator may be, for example, a biimidazole compound, an acylphosphine oxide compound, a phenone compound, an oxime compound, a benzoin compound, a benzophenone compound or a thioxanthone compound.

Examples of the biimidazole compound include
2,2'-bis(2,4-dichlorophenyl)-4,5,4',5'-tetraphenyl-1,2'-biimidazole,
2,2'-bis(2-chlorophenyl)-4,5,4',5'-tetraphenyl-1,2'-biimidazole,
2,2'-bis(2,4,6-trichlorophenyl)-4,4',5,5'-tetraphenyl-1,2'-biimidazole,
2,2'-bis(2,4-dimethylphenyl)-4,5,4',5'-tetraphenyl-1,2'-biimidazole,
2,2'-bis(2-methylphenyl)-4,5,4',5'-tetraphenyl-1,2'-biimidazole, and 2,2'-diphenyl-4,5,4',5'-tetraphenyl-1,2'-biimidazole.

Examples of the acylphosphine oxide compound include 2,4,6-trimethylbenzoyldiphenylphosphine oxide.

Examples of the phenone compound include
diethoxyacetophenone, 2-hydroxy-2-methyl-1-phenylpropan-1-one, benzyl dimethyl ketal,
2-hydroxy-1-[4-(2-hydroxyethoxy)phenyl]-2-methylpropan-1-one,
2-methyl-1-(4-methylthiophenyl)-2-morpholinopropan-1-one,
1-hydroxycyclohexyl-phenyl-ketone,
1-hydroxy-4-methoxyphenyl-phenyl-ketone,
2-benzyl-2-dimethylamino-1-(4-morpholinophenyl)butan-1-one,
2-(2-methylbenzyl)-2-dimethylamino-1-(4-morpholinophenyl)butanone,
2-(3-methylbenzyl)-2-dimethylamino-1-(4-morpholinophenyl)butanone,
2-(4-methylbenzyl)-2-dimethylamino-1-(4-morpholinophenyl)butanone,
2-(2-ethylbenzyl)-2-dimethylamino-1-(4-morpholinophenyl)butanone,
2-(2-propylbenzyl)-2-dimethylamino-1-(4-morpholinophenyl)butanone, and
2-(2-butylbenzyl)-2-dimethylamino-1-(4-morpholinophenyl)butanone.

Examples of the oxime compound include
N-benzoyloxy-1-(4-phenylsulfanylphenyl)butane-1-one-2-imine;
N-ethoxycarbonyloxy-1-phenylpropane-1-one-2-imine;
N-benzoyloxy-1-(4-phenylsulfanylphenyl)octane-1-one-2-imine;
N-acetoxy-1-[9-ethyl-6-(2-methylbenzoyl)-9H-carbazol-3-yl]ethane-1-imine;
N-acetoxy-1-[9-ethyl-6-{2-methyl-4-(3,3-dimethyl-2,4-dioxacyclopentanylmethyloxy)benzoyl}-9H-carbazol-3-yl]ethane-1-imine;
1,2-octanedione, 1-[4-(phenylthio)phenyl]-, 2-(O-benzoyloxime); ethanone,
1-[9-ethyl-6-(2-methylbenzoyl)-9H-carbazol-3-yl]-, 1-(O-acetyloxime); ethanone,
1-[9-ethyl-6-(2-methyl-4-tetrahydrofuranylmethoxybenzoyl)-9H-carbazol-3-yl]-, 1-(O-acetyloxime); and ethanone-1,
[9-ethyl-6-{2-methyl-4-(2,2-dimethyl-1,3-dioxolanyl)methoxybenzoyl}-9H-carbazol-3-yl]-, 1-(O-acetyloxime).

Examples of the benzoin compound include benzoin, benzoin methyl ether, benzoin ethyl ether, benzoin isopropyl ether, and benzoin isobutyl ether.

Examples of the benzophenone compound include benzophenone, methyl o-benzoylbenzoate, 4-phenylbenzophenone, 4-benzoyl-4'-methyldiphenyl sulfide, 3,3',4,4'-bis(diethylamino)benzophenone, 4,4'-tetra(tert-butylperoxycarbonyl)benzophenone, and 2,4,6-trimethylbenzophenone.

Examples of the thioxanthone compound include thioxanthone, 2-chlorothioxanthone, 2-methylthioxanthone, 2-isopropylthioxanthone, 4-isopropylthioxanthone, 2,4-dichlorothioxanthone, 2,4-dimethylthioxanthone, 2,4-diethylthioxanthone, and 2,4-diisopropylthioxanthone.

Among these compounds, from the standpoint of inhibiting self-luminescence of the (flow channel) wall, phenone compounds such as 1-hydroxycyclohexyl-phenyl-ketone and 1-hydroxy-4-methoxyphenyl-phenyl-ketone are preferred.

The content of the photoradical generator in the composition is usually 0.1 to 40 parts by mass, preferably 0.5 to 30 parts by mass, more preferably 1 to 20 parts by mass, with respect to 100 parts by mass of the radical-polymerizable compound. When the content of the photoradical generator is in this range, a patterned resin layer having tackiness and sufficient strength can be formed.

1-3. Cationically Reactive Compound

The cationically reactive compound is a compound having at least two cationically reactive groups, and it is preferably a compound that is cross-linked by reaction caused by cations generated by irradiation with UV in the presence of a photocation generator. In the below-described step (4), since the (flow channel) wall and the cover material are bonded with high bonding strength by the cross-linking reaction of the cationically reactive compound, a flow channel and the like that do not cause leakage or the like of a fluid passing therethrough can be formed.

The cationically reactive compound is a compound other than the radical-polymerizable compound.

Such a cationically reactive compound may be used individually, or two or more thereof may be used.

Examples of the cationically reactive compound include active methylene-containing compounds, such as methylolated amino group-containing compounds, alkyl-etherified amino group-containing compounds, methylol group-containing aromatic compounds and alkyl-etherified aromatic compounds; oxazoline compounds; cyclic ether compounds, such as oxirane ring-containing compounds (epoxy compounds), oxetane ring-containing compounds and cyclic thioether compound; isocyanate group-containing compounds (including blocked isocyanate group-containing compounds); aldehyde group-containing phenol compounds; vinyl ether compounds; and dipropenyl ether compounds. Thereamong, from the standpoint of forming a patterned resin layer showing excellent adhesion with a cover material, cyclic ether compounds are preferred, and oxirane ring-containing compounds and oxetane ring-containing compounds are more preferred. Further, from the standpoints of absorption of the exposure light and inhibiting self-luminescence of the (flow channel) wall, a cationically reactive compound containing no aromatic ring is preferred.

The oxirane ring-containing compounds may be any compound as long as an oxirane ring (also referred to as "oxiranyl group") is contained in the molecule, and examples thereof include phenol novolac epoxy resins, cresol novolac epoxy resins, bisphenol epoxy resins, trisphenol epoxy resins, tetraphenol epoxy resins, phenol-xylylene epoxy resins, naphthol-xylylene epoxy resins, phenol-naphthol epoxy resins, phenol-dicyclopentadiene epoxy resins, alicyclic epoxy resins, and aliphatic epoxy resins.

Specific examples of the oxirane ring-containing compounds include resorcinol diglycidyl ether, trimethylolpropane polyglycidyl ether, glycerol polyglycidyl ether, neopentyl glycol diglycidyl ether, ethylene/polyethylene glycol diglycidyl ether, propylene/polypropylene glycol diglycidyl ether, 1,6-hexanediol diglycidyl ether, sorbitol polyglycidyl ether, propylene glycol diglycidyl ether, and (3',4'-epoxycyclohexane)methyl-3,4-epoxycyclohexylcarboxylate (trade name "CELLOXIDE 2021P", manufactured by Daicel Corporation).

The oxetane ring-containing compounds may be any compound as long as an oxetane ring (also referred to as "oxetanyl group") is contained in the molecule, and specific examples thereof include 1,4-bis{[(3-ethyloxetane-3-yl)methoxy]methyl}benzene (trade name "OXT-121", manufactured by Toagosei Co., Ltd.), 3-ethyl-3-{[(3-ethyloxetane-3-yl)methoxy]methyl}oxetane (trade name "OXT-221", manufactured by Toagosei Co., Ltd.), 4,4'-bis[(3-ethyl-3-oxetanyl)methoxymethyl]biphenyl (trade name "ETERNACOLL OXBP", manufactured by Ube Industries, Ltd.), bis[(3-ethyl-3-oxetanylmethoxy)methyl-phenyl]ether, bis[(3-ethyl-3-oxetanylmethoxy)methyl-phenyl]propane, bis[(3-ethyl-3-oxetanylmethoxy)methyl-phenyl]sulfone, bis[(3-ethyl-3-oxetanylmethoxy)methyl-phenyl]ketone, bis[(3-ethyl-3-oxetanylmethoxy)methyl-phenyl] hexafluoropropane, tri[(3-ethyl-3-oxetanylmethoxy)methyl]benzene, tetra[(3-ethyl-3-oxetanylmethoxy)methyl]benzene, oxetane oligomer (trade name "Oligo-OXT", manufactured by Toagosei Co., Ltd.), and compounds represented by the following Formulae (b3-a) to (b3-f).

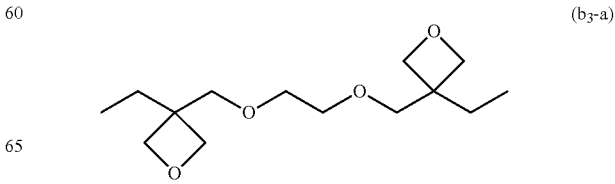

(b3-a)

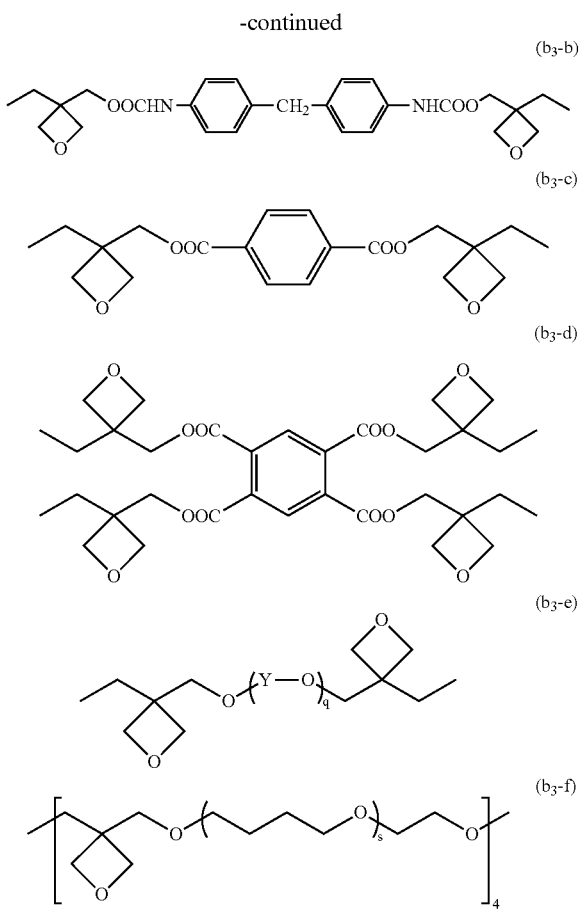

In the Formulae (b3-e) to (b3-f), q and s each independently represent an integer of 0 to 10,000, preferably an integer of 1 to 10; and, in the Formula (b3-e), Y presents an alkanediyl group such as an ethylene group or a propylene group, or a group represented by —CH$_2$-Ph-CH$_2$— wherein, Ph represents a phenylene group.

The ratio of the cationically reactive compound contained in the composition is usually 1 to 60% by mass, preferably 5 to 50% by mass, more preferably 10 to 40% by mass, with respect to 100% by mass of the solids contained in the composition.

The content of the cationically reactive compound is usually 20 to 250 parts by mass, preferably 50 to 200 parts by mass, more preferably 80 to 150 parts by mass, with respect to 100 parts by mass of the radical-polymerizable compound.

By using the cationically reactive compound in this range, a flow channel and the like that have sufficient strength and do not cause leakage or the like of a fluid passing therethrough can be easily formed.

1-4. Photocation Generator

The photocation generator is a compound that generates cations when irradiated with light and initiates cross-linking of the cationically reactive compound by reaction with the cations. The photocation generator is a generator other than the photoradical generator.

From the standpoint of performing the second exposure using UV radiation and inhibiting self-luminescence of the resulting (flow channel) wall, it is preferred that the maximum absorption wavelength of the photocation generator be in the ultraviolet region, preferably 150 nm to 380 nm.

Such a photocation generator may be used individually, or two or more thereof may be used.

The photocation generator may be, for example, an onium salt compound, a halogen-containing compound, a sulfone compound, a sulfonate compound, a sulfonimide compound or a diazomethane compound.

Examples of the onium salt compound include iodonium salts, sulfonium salts, phosphonium salts, diazonium salts, and pyridinium salts. Specific examples of preferred onium salts include diphenyliodonium trifluoromethanesulfonate, diphenyliodonium-p-toluenesulfonate, diphenyliodonium hexafluoroantimonate, diphenyliodonium hexafluorophosphate, diphenyliodonium tetrafluoroborate, triphenylsulfonium trifluoromethanesulfonate, triphenylsulfonium-p-toluenesulfonate, triphenylsulfonium hexafluoroantimonate, 4-t-butylphenyl.diphenylsulfonium trifluoromethanesulfonate, 4-t-butylphenyl.diphenylsulfonium-p-toluenesulfonate, 4,7-di-n-butoxynaphthyltetrahydrothiophenium trifluoromethanesulfonate, 4,7-di-n-butoxynaphthyltetrahydrothiophenium nonafluorobutanesulfonate, 4-(phenylthio)phenyldiphenylsulfonium tris(pentafluoroethyl)trifluorophosphate, and 4-(phenylthio)phenyldiphenylsulfonium hexafluorophosphate.

Examples of the halogen-containing compound include haloalkyl group-containing hydrocarbon compounds and haloalkyl group-containing heterocyclic compounds. Specific examples of preferred halogen-containing compounds include 1,10-dibromo-n-decane; 1,1-bis(4-chlorophenyl)-2,2,2-trichloroethane; and s-triazine derivatives, such as phenyl-bis(trichloromethyl)-s-triazine, 4-methoxyphenyl-bis(trichloromethyl)-s-triazine, styryl-bis(trichloromethyl)-s-triazine, naphthyl-bis(trichloromethyl)-s-triazine and 2-[2-(5-methylfuran-2-yl)ethenyl]-4,6-bis-(trichloromethyl)-1,3,5-triazine.

Examples of the sulfone compound include β-ketosulfone compounds, β-sulfonylsulfone compounds, and α-diazo compound thereof. Specific examples of preferred sulfone compounds include 4-trisphenacylsulfone, mesitylphenacylsulfone and bis(phenacylsulfonyl)methane.

Examples of the sulfonate compounds include alkyl sulfonates, haloalkyl sulfonates, aryl sulfonates and iminosulfonates. Specific examples of preferred sulfonate compounds include benzoin tosylate, pyrogallol tristrifluoromethane sulfonate, o-nitrobenzyltrifluoromethane sulfonate and o-nitrobenzyl-p-toluene sulfonate.

Examples of the sulfonimide compound include
N-(trifluoromethylsulfonyloxy)succinimide,
N-(trifluoromethylsulfonyloxy)phthalimide,
N-(trifluoromethylsulfonyloxy)diphenylmaleimide,
N-(trifluoromethylsulfonyloxy)bicyclo[2.2.1]hept-5-ene-2,3-dicarboxyimide and N-(trifluoromethylsulfonyloxy)naphthylimide.

Examples of the diazomethane compound include
bis(trifluoromethylsulfonyl)diazomethane,
bis(cyclohexylsulfonyl)diazomethane and
bis(phenylsulfonyl)diazomethane.

Among these compounds, onium salt compounds are preferred because they enable to easily form a flow channel and the like that have sufficient strength, show excellent adhesion with the cover material and do not cause leakage or the like of a fluid passing therethrough.

In the composition, the content of the photocation generator is usually 0.1 to 40 parts by mass, preferably 0.5 to 30 parts by mass, more preferably 1 to 20 parts by mass, with respect to 100 parts by mass of the cationically reactive compound. When the content of the photocation generator is in this range, a flow channel and the like that have sufficient strength, show excellent adhesion with a cover material and do not cause leakage or the like of a fluid passing therethrough can be easily formed.

1-5. Protective Group-Containing Amines, Etc.

It is presumed that the protective group-containing amines, etc. have functions of capturing cations generated from the photocation generator in the first exposure and thereby inhibiting the cross-linking of the cationically reactive compound. Inhibition of the cross-linking of the cationically reactive compound caused by the first exposure enables to form a patterned resin layer having sufficient tackiness and to bond a cover material thereon in a favorable manner. From the standpoint of, for example, allowing these effects to be expressed more prominently, protective group-containing amines are preferred as the protective group-containing amines, etc.

The protective group-containing amines, etc. may be used individually, or two or more thereof may be used.

The term "protective group-containing amine" refers to a compound having an amino group and a protective group.

The protective group is a group which has functions of reducing the amine basicity and thereby preventing an amine from acting as a cross-linking accelerator of the cationically reactive compound. Accordingly, in the photosensitive resin composition, a reaction between a protective group-containing amine and the cationically reactive compound can be inhibited and, as a result, excellent storage stability is imparted to the photosensitive resin composition.

Further, a protective group-containing amine has a function of capturing cations by releasing its protective group due to the cations generated from the photocation generator in the first exposure; therefore, the protective group-containing amine is capable of selectively capturing those cations that are selectively generated in exposed parts, so that such cations can be efficiently captured even with a small amount of the protective group-containing amine.

Examples of the protective group include a tert-butoxycarbonyl group, a benzyloxycarbonyl group, a 9-fluorenylmethyloxycarbonyl group, a 2,2,2-trichloroethoxycarbonyl group, an allyloxycarbonyl group, a phthaloyl group, a tosyl group, and a 2-nitrobenzenesulfonyl group. Thereamong, from the standpoints of forming a patterned resin layer having sufficient tackiness and bonding a cover material in a favorable manner, a tert-butoxycarbonyl group is preferred.

Examples of the protective group-containing amine include N-t-butoxycarbonyl group-containing amine compounds, such as
N-t-butoxycarbonyl-di-n-octylamine,
N-t-butoxycarbonyl-di-n-nonylamine,
N-t-butoxycarbonyl-di-n-decylamine,
N-t-butoxycarbonyldicyclohexylamine,
N-t-butoxycarbonyl-1-adamantylamine,
N-t-butoxycarbonyl-N-methyl-1-adamantylamine,
N,N-di-t-butoxycarbonyl-1-adamantylamine,
N,N-di-t-butoxycarbonyl-N-methyl-1-adamantylamine,
N-t-butoxycarbonyl-4,4'-diaminodiphenylmethane,
N,N'-di-t-butoxycarbonylhexamethylenediamine,
N,N,N',N'-tetra-t-butoxycarbonylhexamethylenediamine,
N,N-di-t-butoxycarbonyl-1,7-diaminoheptane,
N,N'-di-t-butoxycarbonyl-1,8-diaminooctane,
N,N'-di-t-butoxycarbonyl-1,9-diaminononane,
N,N'-di-t-butoxycarbonyl-1,10-diaminodecane, N,N'-di-t-butoxycarbonyl-1,12-diaminododecane,
N,N'-di-t-butoxycarbonyl-4,4'-diaminodiphenylmethane,
N-t-butoxycarbonylbenzimidazole,
N-t-butoxycarbonyl-2-methylbenzimidazole,
N-t-butoxycarbonyl-2-phenylbenzimidazole,
N-t-butoxycarbonyl-pyrrolidine, N-t-butoxycarbonyl-piperidine,
N-t-butoxycarbonyl-4-hydroxy-piperidine and
N-t-butoxycarbonyl-morpholine.

The content of the protective group-containing amines, etc. is usually 1 to 50 parts by mass, preferably 5 to 40 parts by mass, more preferably 10 to 30 parts by mass, with respect to 100 parts by mass of the photocation generator.

When the content of the protective group-containing amines, etc. is in this range, a patterned resin layer having sufficient tackiness can be formed and a cover material can thus be favorably bonded thereto.

1-6. Other Components

In the composition, in addition to the above-described components, a variety of components, examples of which include alkali-soluble resins; acid diffusion inhibitors (excluding the protective group-containing amines, etc.); solvents; thermal polymerization inhibitors used for the purpose of, for example, improving the storage stability of the composition; adhesion aids used for the purpose of, for example, improving the adhesion of the resin layer, (flow channel) wall and the like with the support; leveling agents; surfactants; sensitizers; and inorganic particles used for the purpose of, for example, improving the strength of the resin layer, can also be incorporated within a range that does not adversely affect the object and properties of the embodiments of the present invention.

1-6-1. Alkali-Soluble Resin

From the standpoint of, for example, obtaining a composition that has excellent developability, ease of producing a microfluidic device having a desired shape and the like, the above-described composition is preferably developed with an alkaline developer in the below-described step (2). In this case, it is preferred that the composition contain an alkali-soluble resin.

In the embodiments of the present invention, the term "alkali-soluble resin" means that the resin can be dissolved in an alkaline solution such as 2.38%-by-mass aqueous tetramethylammonium hydroxide solution.

Such an alkali-soluble resin may be used individually, or two or more thereof may be used.

The alkali-soluble resin is preferably a resin having at least one acidic group in one molecule. Examples of the acidic group include a carboxyl group, an acid anhydride group, a phenolic hydroxyl group and a sulfo group. As the acidic group, from the standpoint of inhibiting self-luminescence of the resulting (flow channel) wall, an aromatic ring-free carboxyl group, an aromatic ring-free acid anhydride group and an aromatic ring-free sulfo group are preferred.

As such a resin, a copolymer of an ethylenically unsaturated monomer having at least one acidic group (hereinafter, referred to as "unsaturated monomer (1)") and an ethylenically unsaturated monomer that is radically copolymerizable with the unsaturated monomer (1) (hereinafter, referred to as "unsaturated monomer (2)") is preferred.

Examples of the unsaturated monomer (1) include (meth)acrylic acid, maleic acid, maleic anhydride, cyclohexene dicarboxylic acid, cyclohexene dicarboxylic anhydride, mono[2-(meth)acryloyloxyethyl]succinate, ω-carboxypolycaprolactone mono(meth)acrylate, p-isopropenylphenol, and hydroxystyrene.

These unsaturated monomers (1) can be used individually, or two or more thereof may be used.

Examples of the unsaturated monomer (2) include:

N-substituted maleimides, such as N-phenylmaleimide and N-cyclohexylmaleimide;

aromatic vinyl compounds, such as styrene, α-methylstyrene and p-hydroxy-α-methylstyrene;

unsaturated carboxylates, such as methyl(meth)acrylate, n-butyl(meth)acrylate, 2-ethylhexyl(meth)acrylate, 2-hydroxyethyl(meth)acrylate, allyl(meth)acrylate, benzyl (meth)acrylate, polyethylene glycol (n=2 to 10) methyl ether(meth)acrylate, polypropylene glycol (n=2 to 10) methyl ether(meth)acrylate, polyethylene glycol (n=2 to 10) mono(meth)acrylate, polypropylene glycol (n=2 to 10) mono(meth)acrylate, cyclohexyl(meth)acrylate, isobornyl (meth)acrylate, tricyclo[$5.2.1.0^{2,6}$]decan-8-yl(meth)acrylate, dicyclopentenyl(meth)acrylate, glycerol mono(meth)acrylate, and ethylene oxide-modified(meth)acrylate of p-cumylphenol; and macromonomers having a mono(meth)acryloyl group at a terminal of polymer molecular chain, such as polystyrene, polymethyl(meth)acrylate, poly-n-butyl(meth)acrylate and polysiloxane.

These unsaturated monomers (2) may be used individually, or two or more thereof may be used.

In the copolymer of the unsaturated monomer (1) and the unsaturated monomer (2), the copolymerization ratio of the unsaturated monomer (1) is preferably 5 to 50% by mass, more preferably 10 to 40% by mass. By copolymerizing the unsaturated monomer (1) in this range, a composition having excellent storage stability and alkali developability can be obtained.

Examples of the copolymer of the unsaturated monomer (1) and the unsaturated monomer (2) include those copolymers disclosed in JP-A-H7-140654, JP-A-H8-259876, JP-A-H10-31308, JP-A-H10-300922, JP-A-H11-174224, JP-A-H11-258415, JP-A-2000-56118, JP-A-2004-101728 and the like.

As the alkali-soluble resin, for example, as disclosed in JP-A-H5-19467, JP-A-H6-230212, JP-A-H7-207211, JP-A-H11-140144, JP-A-2008-181095 and the like, an alkali-soluble resin having a radical-polymerizable group such as a (meth)acryloyl group in a side chain can be used as well. It is noted here that, in the embodiments of the present invention, such alkali-soluble resins having a radical-polymerizable group are excluded from the above-described radical-polymerizable compound.

From the standpoint of inhibiting self-luminescence of the resulting (flow channel) wall, the alkali-soluble resin is preferably a resin containing no aromatic ring. Further, from the standpoint of forming a patterned resin layer having sufficient strength, an alkali-soluble resin having a radical-polymerizable group such as a (meth)acryloyl group in a side chain is preferred.

From the standpoint of, for example, obtaining a composition having excellent developability and the like, the weight-average molecular weight of the alkali-soluble resin in terms of polystyrene, which is determined by gel permeation chromatography, is usually 1,000 to 1,000,000, preferably 2,000 to 50,000, more preferably 3,000 to 20,000.

From the standpoint of, for example, obtaining a composition that has excellent developability, ease of producing a microfluidic device and the like, the content ratio of the alkali-soluble resin is usually 10 to 80% by mass, preferably 20 to 70% by mass, with respect to 100% by mass of the solids contained in the composition.

1-6-2. Solvent

In the composition, a solvent may also be incorporated for the purposes of improving the handling properties and adjusting the viscosity and the storage stability of the composition.

Such a solvent may be used individually, or two or more thereof may be used.

Examples of the solvent include:

alkylene glycol alkyl ethers, such as ethylene glycol monomethyl ether acetate, ethylene glycol monoethyl ether acetate, ethylene glycol monomethyl ether, ethylene glycol monoethyl ether, ethylene glycol monobutyl ether, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol dipropyl ether, propylene glycol dibutyl ether, propylene glycol monomethyl ether acetate, propylene glycol monoethyl ether acetate, propylene glycol monopropyl ether acetate and propylene glycol monobutyl ether acetate;

carbitols such as butyl carbitol;

lactates, such as methyl lactate, ethyl lactate, n-propyl lactate and isopropyl lactate;

aliphatic carboxylates, such as ethyl acetate, n-propyl acetate, isopropyl acetate, n-butyl acetate, isobutyl acetate, n-amyl acetate, isoamyl acetate, isopropyl propionate, n-butyl propionate and isobutyl propionate;

other esters, such as methyl 3-methoxypropionate, ethyl 3-methoxypropionate, methyl 3-ethoxypropionate, ethyl 3-ethoxypropionate, methyl pyruvate and ethyl pyruvate;

ketones, such as 2-heptanone, 3-heptanone, 4-heptanone and cyclohexanone;

amides such as N,N-dimethylformamide, N-methylacetamide, N,N-dimethylacetamide and N-methylpyrrolidone;

lactones such as γ-butyrolactone; and aromatic hydrocarbons, such as toluene and xylene.

Thereamong, lactates, propylene glycol monoalkyl ether acetates, ethylene glycol monoalkyl ethers and propylene glycol monoalkyl ethers are preferred, and ethyl lactate, propylene glycol monomethyl ether acetate, ethylene glycol monomethyl ether and propylene glycol monomethyl ether are more preferred.

The content of the solvent in the composition is in such a range that allows the composition to have a solid concentration of usually 1 to 80% by mass, preferably 10 to 75% by mass, more preferably 20 to 70% by mass.

1-6-3. Adhesion Aid

In the composition, an adhesion aid may be further incorporated for the purpose of improving the adhesion of the resin layer and the (flow channel) wall with the support.

Such an adhesion aid may be used individually, or two or more thereof may be used.

As the adhesion aid, a functional silane-coupling agent is preferred, and examples thereof include silane coupling agents having a reactive substituent such as a carboxyl group, a (meth)acryloyl group, a vinyl group, an isocyanate group or an epoxy group, specifically trimethoxysilyl benzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane, β-(3,4-epoxycyclohexyl)ethyltrimethoxysilane and 1,3,5-N-tris(trimethoxysilylpropyl)isocyanurate.

In the composition, the content of the adhesion aid is preferably 0.5 to 30% by mass, more preferably 0.5 to 20% by mass, with respect to 100% by mass of the solids contained in the composition.

1-7. Production of Photosensitive Resin Composition

The composition can be produced by homogeneously mixing the above-described components. Further, in order to remove contaminants from the composition, after the components are homogeneously mixed, the resulting mixture may be filtered through a filter or the like.

2. Microfluidic Device

The microfluidic device according to the embodiments of the present invention comprises a flow channel inside a member such as a glass or resin substrate, and the flow channel is characterized by comprising a flow channel wall formed from the above-described composition. The flow channel includes a cover material that covers a groove formed by a support and the flow channel wall, and it is preferably a space formed by the support, the flow channel wall and the cover material, that is, a space surrounded by the support, the flow channel wall and the cover material.

The support is preferably made of a material that allows a resin layer to be formed thereon in a uniform thickness and neither causes deformation or the like nor reacts with a fluid flowing through the flow channel. Examples of the support include base materials made of an inorganic material such as silicon, quartz or silicon carbide; and base materials made of an organic polymer material such as acrylic resin, polystyrene, polycarbonate or polycycloolefin. Further, the surface of the support may also be treated with, for example, a diazo group-containing compound described in WO 2009/121944. For observation of the inside of the flow channel with light, a support having excellent transparency to the light may be used. Further, for observation of the reaction of a fluid flowing through the flow channel, a support having a detection element such as a CMOS image sensor may be used as well. The use of a support having a detection element enables to produce a smaller microfluidic device as compared to a case where the detection element is modularized later on. Moreover, an inlet and/or an outlet may also be arranged on the support for feeding or discharge of a fluid flowing through the flow channel.

The thickness of the support can be selected as appropriate in accordance with the desired use, and it is usually 10 μm to 10 mm.

The resin layer is formed from the above-described composition and may be a single layer or a stack of layers.

The thickness of the resin layer can be selected as appropriate in accordance with the desired use, and it is usually 0.01 to 1,000 μm, preferably 10 to 100 μm.

The cover material is preferably made of a material that neither causes deformation or the like nor reacts with a fluid flowing through the flow channel, and examples of the cover material include the same base materials as those exemplified above for the support. For observation of the inside of the flow channel with light, a cover material having excellent transparency to the light may be used. Further, for observation of the reaction of a fluid flowing through the flow channel, a cover material having a detection element such as a CMOS image sensor may be used as well. The use of a cover material having a detection element enables to produce a smaller microfluidic device as compared to a case where the detection element is modularized later on. Moreover, an inlet and/or an outlet may also be arranged on the cover material for feeding or discharge of a fluid flowing through the flow channel.

The thickness of the cover material can be selected as appropriate in accordance with the desired use, and it may be about the same as that of the support and is usually 10 μm to 10 mm.

The size of the flow channel (distance between flow channel walls) is selected as appropriate in accordance with the intended purpose, and it is usually 1 to 100 μm, preferably 10 to 60 μm. According to the embodiments of the present invention, even a flow channel of such a fine shape can be formed easily.

By reducing the size of the flow channel, reactants contained in a fluid, such as a substrate, are allowed to react quickly and efficiently.

When the flow channel is cut in the direction substantially perpendicular to the lengthwise direction, the shape of the cross section may be circular or polygonal, and it is usually circular or quadrangular.

In the flow channel, a reservoir in which a fluid is retained may be arranged as well. Each end of the flow channel is connected to either the inlet or the outlet. The flow channel may branch and merge inside the device. Further, a plurality of inlets and outlets may be arranged, and the number of the inlets and that of the outlets may be different from each other.

The concrete constitution of the microfluidic device is decided in accordance with the desired use and the like thereof and, for example, it may be of a device that comprises: a micrometer-order fine flow channel inside a member such as a glass or resin substrate; and elements such as a pump element provided for transport of a fluid through the flow channel. Other examples of the elements include: elements which, in the course of a fluid entering the flow channel and being discharged therefrom, heat or cool the fluid, dilute or concentrate the fluid, allow the fluid to chemically react, control the state of the flow such as speed and branching of the flow, or control the mixing, dissolution, separation and the like of the fluid; and detection elements that perform electrical or optical measurement.

Depending on the intended use of the microfluidic device of the embodiments of the present invention, it is desired that the inner wall of the flow channel, preferably at least either the support or the cover material, have a detection element because, for example, this makes it easy to perform detection, separation, analysis, extraction and the like of a substance to be measured and enables to produce a smaller microfluidic device.

When the support or the cover material has the above-described detection element, an electrode and a conductor unit may also be arranged for establishing connection to the detection element. The electrode and conductor unit are designed in such a manner that, for example, they are electrically connected to a reading unit engaged with a housing in which the microfluidic device of the embodiments of the present invention is stored. The electrode and conductor unit are made of an electroconductive material such as gold, indium tin oxide (ITO), silver, platinum, palladium, aluminum, copper or titanium nitride and may each be, for example, a metal film formed by a known method such as photolithography, screen printing or sputtering.

The microfluidic device of the embodiments of the present invention can be used as, for example, a microreaction element (microchip or microreactor) for chemistry, biochemistry and the like, a DNA analysis element, a microelectrophoretic element, a microchromatographic element, a microelement for preparation of a sample to be analyzed by mass spectroscopy, liquid chromatography or the like, an element for physiochemical treatments such as extraction, membrane separation and dialysis, and a spotter for microarray production.

3. Method of Producing Microfluidic Device

The method of producing a microfluidic device according to the embodiments of the present invention comprises:

a step (1) of forming a resin layer from the above-described composition on a support;

a step (2) of partially UV-exposing and developing the resin layer;

a step (3) of preparing a laminate by placing a cover material on the thus developed resin layer; and a step (4) of UV-exposing the laminate obtained in the step (3).

According to this method, since the resulting patterned resin layer has sufficient strength and tackiness, a microfluidic device comprising a favorable flow channel and the like can be produced.

FIG. 1(a) to FIG. 1(f) are a set of cross-sectional schematic views illustrating one example of the production method of the embodiments of the present invention. The production method of the embodiments of the present invention will now be described referring to FIG. 1(a) to FIG. 1(f).

3-1. Step (1)

The step (1) is a step of forming a resin layer 20 from the above-described composition on a support 10 (FIG. 1(a)).

Specific examples of the support 10 are the same as those described above in the section "2. Microfluidic Device".

Examples of a method of forming the resin layer 20 include a method of directly forming the resin layer 20 on the support 10; and a method of forming a coating film using the above-described composition on a release-treated organic film such as a PET film to obtain a dry film and subsequently transferring the dry film onto the support 10 by a lamination method. Particularly, for the formation of a flow channel of a small size (flow channel diameter: the diameter of a cross-section obtained by cutting the flow channel in the direction substantially perpendicular to the lengthwise direction), it is preferred that the resin layer 20 have a uniform thickness, and a method of directly forming the resin layer 20 with excellent uniformity in thickness on the support 10 is preferably employed.

As the method of directly forming the resin layer 20 on the support 10 or the method of forming a coating film on an organic film, for example, a method of coating the composition on the support 10 or organic film by a coating method such as spin coating, ink-jet coating, spray coating or bar coating can be employed. Among these coating methods, spin coating is preferred because, for example, it yields a resin layer having excellent thickness uniformity. Further, prior to the coating of the composition on the support 10, from the standpoints of the coating properties of the composition on the support 10 and adhesion between the support 10 and the resin layer 20, a surface treatment agent such as hexamethyldisilazane may be applied in advance to the coating surface of the support 10.

After coating the composition on the support 10, for example, the resulting coating film can be made uniform by heating it using a hot plate or the like. As for the heating conditions, the heating is usually performed at 60 to 250° C. for 10 seconds to 10 minutes.

3-2. Step (2)

The step (2) is a step of partially exposing (first exposure) and developing the resin layer 20 to form a patterned resin layer 21. The term "partially" used herein means that the resin layer 20 is exposed through, for example, a mask 50 which blocks light for those parts corresponding to the flow channel and the like, in such a manner that a desired pattern is obtained (FIG. 1(b)). In those parts of the resin layer 20 exposed to an exposure light 51, radicals generated by the photoradical generator contained in the resin layer 20 induce cross-linking reaction of the radical-polymerizable compound. Then, non-exposed parts of the resin layer 20 are dissolved and removed with a developer to form the patterned resin layer 21 and groove 40.

As the exposure light 51, UV radiation, preferably a UV ray having a wavelength of 150 to 380 nm (e.g., i-line (365 nm)) is used. For example, when a high-pressure mercury lamp is used for the exposure light, the cumulative irradiation dose of the exposure light 51 is usually 10 to 10,000 mJ/cm$^2$, preferably 50 to 5,000 mJ/cm$^2$.

By controlling the irradiation dose in the step (2) within the above-described range, a patterned resin layer that shows sufficient developer resistance and has tackiness and sufficient strength with a good balance can be easily obtained.

In order to adjust the curing degree of the exposed parts, a heat treatment may also be performed after the exposure. As for the conditions of the heat treatment, the heat treatment is usually performed at 60 to 180° C. for 30 to 300 seconds.

In the development performed after the exposure, the patterned resin layer (in a semi-cured state) 21 is formed on the support 10 by dissolving and removing non-exposed parts of the resin layer 20 using, usually, an alkaline developer (FIG. 1(c)).

The term "semi-cured state" refers to a state where the resin layer is cured to such an extent that its tackiness (adhesive strength) is not lost and the gel fraction is 5 to 90% or so. The gel fraction can be calculated in percentage as a ratio of the mass of gel remaining after extracted with a solvent which can dissolve the uncured parts of the resin layer with respect to the mass of the patterned resin layer in a semi-cured state.

Examples of a development method using a developer include a shower development method, a spray development method, an immersion development method and a puddle development method. As for the development conditions, the development is usually performed at 20 to 40° C. for 1 to 10 minutes.

Examples of the alkaline developer include aqueous alkaline solutions obtained by dissolving an alkaline compound, such as sodium hydroxide, potassium hydroxide, aqueous ammonia, tetramethylammonium hydroxide or choline, in water at a concentration of 1 to 10% by mass. To the aqueous alkaline solutions, for example, an aqueous organic solvent such as methanol or ethanol, or a surfactant may be added in an appropriate amount.

Further, after the development, the thus developed resin layer may be washed with water and then dried.

For example, resin layers of various shapes such as a pillar pattern (in the case of a pillar-type microfluidic device) can be formed from the above-described composition; therefore, the pattern shape of the patterned resin layer 21 may be selected as appropriate in accordance with the intended use of the microfluidic device.

The pattern shape to be formed may be, for example, any of the shapes described in Japanese Translated PCT Patent Application Laid-open No. 2009-501908, JP-A-2005-329479, JP-A-2004-130219 and JP-A-2010-237053.

The distance between the patterned resin layers 21 is usually 1 to 100 μm and selected as appropriate in accordance with the purpose thereof.

2-3. Step (3)

The step (3) is a step of preparing a laminate by placing a cover material 30 on the patterned resin layer 21 (FIG. 1(d)).

The cover material 30 may be placed via a conventionally known adhesive or the like; however, since the patterned resin layer 21 has tackiness, according to the production method of the embodiments of the present invention, not only a (flow channel) wall having sufficient adhesive strength can be formed even without the use of such an adhesive, but also the production line of microfluidic device can be simplified.

Specific examples of the cover material 30 are the same as those described above in the section "2. Microfluidic Device".

2-4. Step (4)

The step (4) is a step of exposing the laminate obtained in the step (3) with an exposure light 52 (second exposure) (FIG. 1(e)). By this step, (flow channel) wall 22 and the cover material 30 are integrated (bonded) and a flow channel 41 and the like having a desired shape are formed inside the member (FIG. 1(f)).

In the step (4), it is preferred that the laminate be exposed in such a manner that the patterned resin layer 21 is sufficiently cured (gel fraction≈100%).

As for the conditions of such exposure, UV radiation, preferably a UV ray having a wavelength of 150 to 380 nm (e.g., i-line (365 nm)) is used and, for example, when a high-pressure mercury lamp is used for the exposure light, the cumulative irradiation dose is usually 10 to 10,000 mJ/cm$^2$, preferably 50 to 5,000 mJ/cm$^2$.

Further, it is preferred that the dose of the UV-exposure in the step (2) be less than the dose of the UV-exposure in the step (4), that is, it is preferred that the dose of the UV-exposure in the step (4) be greater than the dose of the UV-exposure in the step (2). By this embodiment, a greater amount of cations than the amount of the photocation generator degraded into cations by the first exposure can be used for the bonding by the second exposure, so that not only the patterned resin layer after lithography has sufficient strength and tackiness but also a favorable flow channel in which the (flow channel) wall after the second exposure is bonded with the cover material with high bonding strength can be formed.

It is also preferred that the light source of the UV-exposure in the step (2) be the same as the light source of the UV-exposure in the step (4), because this enables to reduce the production cost.

The exposure can be performed from the side of the support or from the side of the cover material.

During the exposure, a pressure may be applied to the laminate. By the application of pressure, bonding of the cover material 30 and the patterned resin layer 21 can be ensured.

In order to sufficiently cure the (flow channel) wall 22, a heat treatment may also be performed after the exposure. As for the conditions of the heat treatment, the heat treatment is usually performed at 100 to 250° C., preferably 150 to 230° C., for 30 minutes to 10 hours. In this heat treatment, in order to inhibit deformation and the like, heating may be performed in two steps and, as for the conditions of this case, for example, heating is performed at a temperature of 50 to 250° C. for 30 seconds to 2 hours in the first step, followed by heating at the same temperature or a temperature higher than the first step for 20 minutes to 8 hours in the second step.

For example, in order to inhibit adhesion of the fluid flowing through the flow channel, those parts of the (flow channel) wall 22 that constitute the inner surface of the flow channel and the like may also be subjected to a surface treatment such as electrodeposition or electroless plating.

EXAMPLES

The present invention will now be described in more detail by way of examples thereof; however, the present invention is not restricted thereto. In the following descriptions of Examples and the like, "part(s)" represents "part(s) by mass" unless otherwise specified.

<Production of Photosensitive Resin Compositions>

Examples 1A to 9A and Comparative Example 1A

The photosensitive resin compositions of Examples 1A to 9A and Comparative Example 1A were each produced by homogenously mixing the respective types and amounts of the components as shown in Table 1.

The details of the components in Table 1 are as follows.
Radical-polymerizable compound (A1): KAYARAD DPHA (trade name, manufactured by Nippon Kayaku Co., Ltd.)
Radical-polymerizable compound (A2): butylene glycol diacrylate
Radical-polymerizable compound (A3): a compound represented by the following Formula (A3)
Radical-polymerizable compound (A4): a compound represented by the following Formula (A4)
Radical-polymerizable compound (A5): a reaction product of hydrogenated phthalic acid and epoxy acrylate (trade name "DENACOL DA-722", manufactured by Nagase ChemteX Corporation)
Photoradical generator (B1): a compound represented by the following Formula (B1)
Photoradical generator (B2):
2,4,6-trimethylbenzoyldiphenylphosphine oxide
Cationically reactive compound (C1): DENACOL EX321L (trade name, manufactured by Nagase ChemteX Corporation)
Cationically reactive compound (C2): a bisphenol epoxy resin (trade name "EP-4000L", manufactured by ADEKA Corporation)
Photocation generator (D1): a compound represented by the following Formula (D1)
Protective group-containing amine (E1):
N-tert-butoxycarbonyl-2-phenylbenzimidazole
Alkali-soluble resin (F1): a polymer having a structural unit represented by the following Formula (F1)
Adhesion aid (G1): 3-glycidyloxypropyltriethoxysilane
Solvent (H1): propylene glycol monomethyl ether acetate

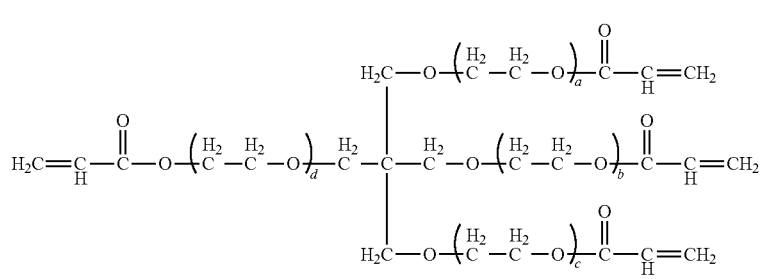

(A3)

a+b+c+d=4

-continued
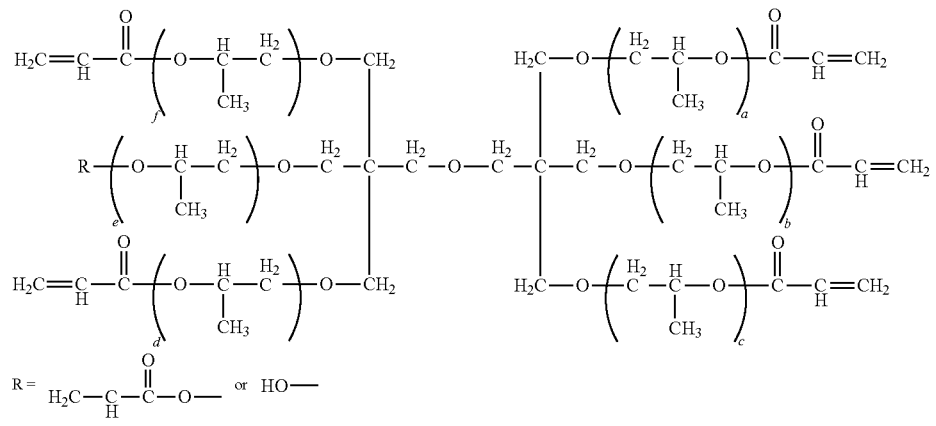
(A4)
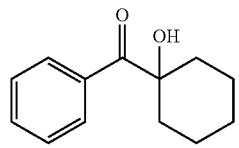
(B1)
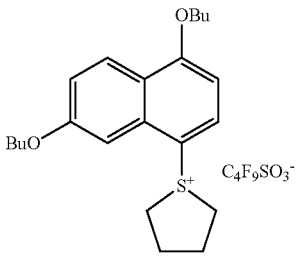
(D1)
wherein, Bu represents a n-butyl group.
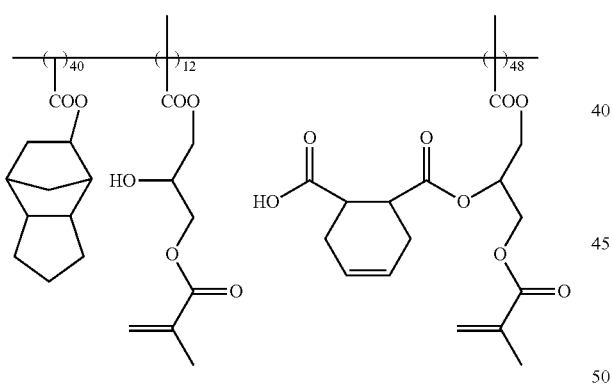
(F1)
TABLE 1
| Component | Example 1A | Example 2A | Example 3A | Example 4A | Example 5A |
|---|---|---|---|---|---|
| A1 | 30 parts | 30 parts | 30 parts | 100 parts | |
| A2 | | | | | 100 parts |
| A3 | | | | | |
| A4 | | | | | |
| A5 | | | | | |
| B1 | 5 parts | 5 parts | 5 parts | 5 parts | 5 parts |
| B2 | | | | | |
| C1 | 30 parts | 30 parts | 30 parts | 100 parts | 100 parts |
| C2 | | | | | |
| D1 | 5 parts | 5 parts | 5 parts | 5 parts | 5 parts |
| E1 | 0.7 parts | 1.4 parts | 0.7 parts | 0.7 parts | 0.7 parts |
| F1 | 100 parts | 100 parts | 100 parts | 100 parts | 100 parts |

TABLE 1-continued

| | | | | | |
|---|---|---|---|---|---|
| G1 | | | 2.5 parts | | |
| H1 | 170 parts | 170 parts | 170 parts | 170 parts | 170 parts |

| Component | Example 6A | Example 7A | Example 8A | Example 9A | Comparative Example 1A |
|---|---|---|---|---|---|
| A1 | | | | | 30 parts |
| A2 | | | | | |
| A3 | 100 parts | | | | |
| A4 | | 100 parts | | | |
| A5 | | | 100 parts | 100 parts | |
| B1 | 5 parts | 5 parts | 4 parts | 4 parts | 5 parts |
| B2 | | | 1 part | 1 part | |
| C1 | 100 parts | 100 parts | 100 parts | | 30 parts |
| C2 | | | | 100 parts | |
| D1 | 5 parts | 5 parts | 5 parts | 5 parts | 5 parts |
| E1 | 0.7 parts | 0.7 parts | 0.7 parts | 0.7 parts | |
| F1 | 100 parts | 100 parts | 100 parts | 100 parts | 100 parts |
| G1 | | | | | |
| H1 | 170 parts | 170 parts | 170 parts | 170 parts | 170 parts |

<Production of Microfluidic Devices>

Example 1B

The photosensitive resin composition of Example 1A was coated on a glass substrate (support) by a spin coating method, and the resultant was heated on a hot plate at 110° C. for 3 minutes to form a resin layer. This resin layer was exposed (apparatus: "MA8" manufactured by SUSS Micro-Tec AG; high-pressure mercury lamp, irradiation dose: 500 mJ/cm$^2$) through a mask partially having light-shielding sections. Then, the resulting resin layer was developed with a basic developer (trade name: "OPD5262", manufactured by FUJIFILM Corporation) and subsequently washed with water to form a patterned resin layer. This patterned resin layer had a width of 40 μm, a pattern resin layer gap of 40 μm and a height (thickness) of 15 μm.

A glass substrate (cover material) was placed on the patterned resin layer and pressed for 2 seconds with a force of 40 N using a die bonder (apparatus: "FTD-1940", manufactured by Shibaura Mechatronics Corporation) to form a laminate. Then, using the same apparatus as described above, the cover material side of the thus obtained laminate was UV-exposed (high-pressure mercury lamp, irradiation dose: 3,000 mJ/cm$^2$) to produce a microfluidic device composed of the support, flow channel wall and cover material.

Whether or not the flow channel wall and the cover material were bonded with each other was evaluated using a multipurpose bondtester. Specifically, using a multipurpose bondtester (trade name "DAGE 4000", manufactured by Nordson DAGE), the evaluation was made based on the result of applying a shearing force (2 MPa, at a rate of 500 μm/sec, 23° C.) in the direction parallel to the surface of the cover material (glass substrate). The evaluation criteria were as follows.

A: Application of a 2-MPa shearing force did not cause detachment between the flow channel wall and the cover material.

B: Application of a 2-MPa shearing force caused detachment between the flow channel wall and the cover material.

The presence or absence of self-luminescence of the microfluidic device was evaluated using "INFINITE M1000" (trade name, manufactured by Tecan Trading AG). The evaluation criteria were as follows.

A: The fluorescence intensity was less than 20,000 L/g·cm in all cases of excitation with a light having an excitation wavelength of 352 nm, 365 nm, 436 nm, 470 nm, 500 nm, 550 nm or 650 nm.

B: The fluorescence intensity was 20,000 L/g·cm or higher in any one of the cases of excitation with a light having an excitation wavelength of 352 nm, 365 nm, 436 nm, 470 nm, 500 nm, 550 nm or 650 nm.

Examples 2B to 9B and Comparative Example 1B

The microfluidic devices of Examples 2B to 9B and Comparative Example 1B were prepared in the same manner as in Example 1B, except that the photosensitive resin compositions of Examples 2A to 9A and Comparative Example 1A were used, respectively. The thus obtained microfluidic devices were evaluated in the same manner as in Example 1B. The evaluation results are shown in Table 2.

TABLE 2

| | Example 1B | Example 2B | Example 3B | Example 4B | Example 5B | Example 6B | Example 7B | Example 8B | Example 9B | Comparative Example 1B |
|---|---|---|---|---|---|---|---|---|---|---|
| Bonding property | A | A | A | A | A | A | A | A | A | B |
| Self-luminescence | A | A | A | A | A | A | A | A | A | A |

Obviously, numerous modifications and variations of the present invention are possible in light of the above teachings. It is therefore to be understood that within the scope of the appended claims, the invention may be practiced otherwise than as specifically described herein.

The invention claimed is:

1. A method of producing a microfluidic device, said method comprising:
   a step (1) of forming a resin layer on a support from a photosensitive resin composition that comprises a compound having at least two radical-polymerizable groups, a photoradical generator, a compound having at least two cationically reactive groups, a photocation generator, and a protective group-containing amine, wherein the protective group-containing amine is an N-t-butoxycarbonyl group-containing amine compound;
a step (2) of UV-exposing parts of said resin layer and developing said resin layer;
a step (3) of preparing a laminate by placing a cover material on the thus developed resin layer; and
a step (4) of UV-exposing the thus obtained laminate.

2. The method according to claim 1, wherein said photosensitive resin composition further comprises an alkali-soluble resin.

3. The method according to claim 1, wherein a dose of UV-exposure in said step (2) is less than a dose of UV-exposure in said step (4).

4. The method according to claim 1, wherein a light source of said UV-exposure in said step (2) is the same as a light source of said UV-exposure in said step (4).

5. The method according to claim 1, wherein the compound having at least two cationically reactive groups is selected from the group consisting of an active methylene-containing compound, an oxazoline compound, a cyclic ether compound, an isocyanate group-containing compound, an aldehyde group-containing phenol compound, a vinyl ether compound and a dipropenyl ether compound.

6. The method according to claim 1, wherein the developing in step (2) comprises removing an unexposed portion of the resin layer.

7. A microfluidic device comprising a flow channel inside a member, said microfluidic device comprising:
a flow channel wall formed on a support using a photosensitive resin composition that comprises a compound having at least two radical-polymerizable groups, a photoradical generator, a compound having at least two cationically reactive groups, a photocation generator, and a protective group-containing amine, wherein the protective group-containing amine is an N-t-butoxycarbonyl group-containing amine compound; and
a cover material that covers a groove formed by said support and said flow channel wall.

8. The microfluidic device according to claim 7, wherein the compound having at least two cationically reactive groups is selected from the group consisting of an active methylene-containing compound, an oxazoline compound, a cyclic ether compound, an isocyanate group-containing compound, an aldehyde group-containing phenol compound, a vinyl ether compound and a dipropenyl ether compound.

9. A photosensitive resin composition comprising: a compound having at least two radical-polymerizable groups; a photoradical generator; a compound having at least two cationically reactive groups; a photocation generator; and a protective group-containing amine, wherein the protective group-containing amine is an N-t-butoxycarbonyl group-containing amine compound.

10. The photosensitive resin composition according to claim 9, wherein the compound having at least two cationically reactive groups is selected from the group consisting of an active methylene-containing compound, an oxazoline compound, a cyclic ether compound, an isocyanate group-containing compound, an aldehyde group-containing phenol compound, a vinyl ether compound and a dipropenyl ether compound.

* * * * *